US010012681B2

(12) United States Patent
Wimmer

(10) Patent No.: US 10,012,681 B2
(45) Date of Patent: Jul. 3, 2018

(54) TESTING OF A SUBSTATION AUTOMATION SYSTEM

(71) Applicant: ABB Technology AG, Zurich (CH)

(72) Inventor: Wolfgang Wimmer, Langenthal (CH)

(73) Assignee: ABB Schweiz AG, Baden (CH)

( * ) Notice: Subject to any disclaimer, the term of this patent is extended or adjusted under 35 U.S.C. 154(b) by 281 days.

(21) Appl. No.: 15/081,333

(22) Filed: Mar. 25, 2016

(65) Prior Publication Data
US 2016/0209450 A1   Jul. 21, 2016

Related U.S. Application Data

(63) Continuation of application No. PCT/EP2014/070592, filed on Sep. 26, 2014.

(30) Foreign Application Priority Data

Sep. 27, 2013  (EP) ..................................... 13186507

(51) Int. Cl.
*G01R 21/133* (2006.01)
*H04L 12/26* (2006.01)
(Continued)

(52) U.S. Cl.
CPC .......... *G01R 21/133* (2013.01); *H02H 3/044* (2013.01); *H02H 7/26* (2013.01); *H04L 43/50* (2013.01); *Y04S 40/168* (2013.01)

(58) Field of Classification Search
CPC .................................................. G01R 21/133
See application file for complete search history.

(56) References Cited

U.S. PATENT DOCUMENTS

2002/0173927 A1   11/2002   Vandiver
2009/0070062 A1*  3/2009   Kirrmann ............ G01R 31/327
                                                     702/122

FOREIGN PATENT DOCUMENTS

WO   2009053488 A1   4/2009
WO   2009135512 A1   11/2009

OTHER PUBLICATIONS

Reckerd et al., Applicaton of Peer-to-Peer Communication, for Protection and Control, at Seward Distribution Substation, Protective Relay Engineers, 2005 58th Annual Conference for Texas A&M University, Apr. 5, 2005, pp. 40-45.
(Continued)

*Primary Examiner* — Clayton E Laballe
*Assistant Examiner* — Jas Sanghera
(74) *Attorney, Agent, or Firm* — Taft Stettinius & Hollister LLP; J. Bruce Schelkopf

(57) ABSTRACT

The invention supports and promotes testing of Substation Automation (SA) functions involving intermediary Logical Nodes (LN) in SA systems of operating substations, specifically with minimized impact on the substation and/or the SA system and without having to completely deactivate or isolate entire parts of the substation. A test is set up by defining at least one input LN where the test scenario input signals will be applied, and by determining output LNs where expected output values shall be observed. Based on the data flow between LNs as defined in the System Configuration Description (SCD) file a test preparing tool automatically determines all intermediary LNs logically arranged between these input and output LNs. The intermediary LNs and the IEDs that are affected by the function test are identified and subsequently marked for "test" or "simulation" mode.

5 Claims, 2 Drawing Sheets

(51) Int. Cl.
H02H 3/04 (2006.01)
H02H 7/26 (2006.01)

(56) References Cited

OTHER PUBLICATIONS

Dolezilek, Case Study Examples of Interoperable Ethernet Communications Within Distribution, Transmission, and Wide-Area Control Systems. Communications Workshops (ICC), 2010 IEEE International Conference, May 23, 2010, pp. 1-7.
Communication Networks and Systems in Substations, Jan. 1, 2004, pp. 1-150.
International Search Report and Written Opinion, ABB Technology AG, PCT/EP2014/070592, dated Aug. 5, 2015, 11 pages.
European Search Report, ABB Technology AG, EP 13186507.3, dated Feb. 28, 2014, 8 pages.

* cited by examiner

Fig. 2

```xml
<IED name="AA1C1Q01A1" desc="C1Q01A1" type="IED670" manufacturer="ABB" configVersion="C670_Iver1.1_IEC">
...
<AccessPoint name="S1">
<LDevice inst="LD0">
<LN0 inst="" lnClass="LLN0" lnType="IED670@IEC61850@@@ABBIED670_LLN0@1">
<DataSet name="InterlockingA" desc="Data required for distributed interlocking. Quality included.">
<FCDA ldInst="LD0" prefix="S" lnClass="CSWI" lnInst="1" doName="Pos" daName="stSeld" fc="ST" />
<FCDA ldInst="LD0" prefix="S" lnClass="CSWI" lnInst="2" doName="Pos" daName="stSeld" fc="ST" />
<FCDA ldInst="LD0" prefix="S" lnClass="CSWI" lnInst="3" doName="Pos" daName="stSeld" fc="ST" />

<GSEControl name="gcb_A" desc="Data required for distributed interlocking." dataSet="InterlockingA" confRev="1" appID="InterlockingA">
<IEDName>AA1C1Q07A1</IEDName> <!-- the destination IEDs; the LD can be derived from the input section at the destination IED -->
<IEDName>AA1C1Q05A1</IEDName>
</GSEControl>
</LN0>

<LDevice inst="SES_1"> <!-- a second logical device; its Input section defines, which signals from other IEDs are determined for this LD -->
<LN0 inst="" lnClass="LLN0" lnType="IED670@IEC61850@@@ABBIED670_RSY1LLN0@1">
<Inputs>
<ExtRef iedName="AA1C1Q05A1" ldInst="LD0" prefix="S" lnClass="CSWI" lnInst="1" doName="Pos" daName="stSeld" />
<ExtRef iedName="AA1C1Q05A1" ldInst="LD0" prefix="S" lnClass="CSWI" lnInst="2" doName="Pos" daName="stSeld" />
...
</AccessPoint>
...
</IED>
```

TESTING OF A SUBSTATION AUTOMATION SYSTEM

CROSS REFERENCE TO RELATED APPLICATIONS

The present application is a continuation of International Application No. PCT/EP2014/070592, filed Sep. 26, 2014, which is incorporated herein by reference in its entirety.

FIELD OF THE INVENTION

The invention relates to the field of testing of Substation Automation systems with a standardized configuration representation, in particular to testing of Substation Automation systems of operating substations in high and medium-voltage power networks.

BACKGROUND OF THE INVENTION

Substations in high and medium-voltage power networks include primary devices such as electrical cables, lines, bus bars, switches, power transformers and instrument transformers, which are generally arranged in switch yards and/or bays. These primary devices are operated in an automated way via a Substation Automation (SA) system. The SA system comprises secondary devices, so-called Intelligent Electronic Devices (IED), responsible for protection, control and monitoring of the primary devices. The IEDs may be assigned to hierarchical levels, i.e. the station level, the bay level, and the process level, the latter being separated from the bay level by a so-called process interface. The station level of the SA system includes an Operator Work Station (OWS) with a Human-Machine Interface (HMI) and a gateway to a Network Control Centre (NCC). IEDs on the bay level, also termed bay units, in turn are connected to each other as well as to the IEDs on the station level via an inter-bay or station bus primarily serving the purpose of exchanging commands and status information. IEDs on the process-level comprise electronic sensors for voltage (VT), current (CT) and gas density measurements, contact probes for sensing switch and transformer tap changer positions, and/or intelligent actuators (I/O) for controlling switchgear like circuit breakers or disconnectors. Exemplary process-level IEDs such as non-conventional current or voltage transformers comprise an Analogue to Digital (AD) converter for sampling of analogue signals. Process-level IEDs are connected to the bay units via a process bus, which can be considered as the process interface replacing a conventional hard-wired process interface.

A communication standard for communication between the secondary devices of a substation has been introduced by the International Electrotechnical Committee (IEC) as part of the standard IEC 61850 entitled "communication networks and systems in substations". For non-time critical messages, IEC 61850-8-1 specifies the Manufacturing Message Specification (MMS, ISO/IEC 9506) protocol based on a reduced Open Systems Interconnection (OSI) protocol stack with the Transmission Control Protocol (TCP) and Internet Protocol (IP) in the transport and network layer, respectively, and Ethernet as physical media. For time-critical event-based messages, IEC 61850-8-1 specifies the Generic Object Oriented Substation Events (GOOSE) directly on the Ethernet link layer of the communication stack. For very fast periodically changing signals at the process level such as measured analogue voltages or currents IEC 61850-9-2 specifies the Sampled Value (SV) service, which like GOOSE builds directly on the Ethernet link layer. Hence, the standard defines a format to publish, as multicast messages on an industrial Ethernet, event-based messages and digitized measurement data from current or voltage sensors on the process level. SV and GOOSE messages are transmitted over a process bus.

SA systems based on IEC 61850 are configured and described by means of a standardized configuration representation or formal system description called System Configuration Description (SCD). An SCD file comprises the logical data flow between the IEDs on the basis of message types or data sets, i.e. for every message source, a list of destination or receiver IEDs, the message size in terms of data set definitions, as well as the message sending rates for all periodic traffic like GOOSE, SV and Integrity reports. The SCD file likewise comprises the relation between the IEDs as well as the functionality which the IEDs execute on behalf of the substation process or switch yard.

IEC 61850 not only specifies the method of the data transfer but also defines the process data of the servers. For that purpose, IEC 61850 uses an object-oriented approach with Logical Nodes (LN) as core objects which can be grouped under different Logical Devices (LD). A LN is a functional grouping of data with corresponding attributes and represents the smallest entity that may be independently implemented in, or hosted by, an individual IED. Examples are all data of a circuit breaker contained in the Logical Node XCBR or all data of a timed overcurrent protection contained in the Logical Node PTOC. There are LNs for data/functions related to LDs (LLN0) and for common device properties of physical devices (LPHD).

SA systems include a number of basic SA functions for protecting, controlling, or monitoring of the substation, which functions relate to individual pieces of primary equipment or to entire substation parts such as bays, voltage levels or bus bars. In the exemplary context of protection typical such functions are distance protection, line protection, breaker failure protection and differential protection. In addition, higher-level applications are provided, which may concern more than one piece of primary equipment, and which include station-level interlocking, station and bay level switching sequences, transformer parallel control, transformer auto close functions, as well as any other kind of load transfer and/or shedding.

The standard IEC 61850 defines basic features which can be used to set up functional and performance tests inside a distributed system, in particular for SA systems with serial or process-bus connection to the process. As even a segment-wise isolation of the process-bus for the purpose of testing a specific protection function and thereby disabling all other functions sharing the process bus segment is not acceptable for operating or live systems, specific operating modes have been introduced. For instance, only a Logical Node in a "test" mode as coded by the value of the "Beh" data object of the LN and indicated in the "q" attribute of all its other data objects accepts test signals with an input signal quality attribute "test". These test signals include preconfigured or predefined test data stored on the host device. In case of missing test signals, the LN in "test" mode also accepts live data obtained from the actual operating process. On the other hand, an IED in "simulation" mode as coded by the "Sim" attribute inside the IED's LPHD allows the IED to switch to simulated data exclusively received via simulated GOOSE or SV data sets as coded by a corresponding flag in the respective GOOSE or SV message header.

These modes thus determine how input signal test quality works together with the LN modes. Further features within the testing concept include a "test blocked" mode for deactivating hardware output signals thus preventing actions on a primary equipment level, and "mirror back" signals (opRcvd, opOk) of actions at all process related output signals.

However, the above concept ignores the fact that only for the most basic functions the totality of the involved LNs and hosting IEDs is easily identifiable. In fact, any slightly more complex functionality may involve one or several intermediary LNs logically interconnected between an input LN and output LN that are under control of the tester. In a conservative approach, any test on an operating system demands a straightforward and complete deactivation of all parts of the substation, i.e. of the bays, voltage levels or bus bar sections possibly concerned by the test, in order to prevent any uncontrolled, let alone detrimental operation of a piece of primary equipment.

The patent application EP 2203754 is concerned with the operation of substations in which protection, control and measurement IEDs exchange operational data over a data network, for instance according to IEC standard 61850. During maintenance, commissioning and fault situations when one or several IEDs are inoperable, the data that these IEDs would have produced is substituted to ensure availability of the substation. To this effect, a dedicated substitute device is permanently installed that can take the role of any missing IED, and that is automatically configured out of the SCD file that describes the SA system. The simulated operational data may comprise status information or process values assigned to an unrepresented piece of primary substation equipment and substituting real data determined by a sensor connected to the piece of primary equipment.

In the patent application EP 2362577, every network message configured for transmission from a sender to a receiver IED across an Ethernet switch-based communication network of a PC or SA system is evaluated, and a graphical representation respective of process related operational aspects of each IED involved is generated and displayed. From a logical data flow description that is part of a formal configuration representation of the PC or SA system, sender and receiver IEDs are retrieved or determined. Likewise, a single one out of a plurality of operational aspect of the process is retrieved for each IED from the formal configuration description. Generating the graphical representation of the system includes forming groups of IEDs with identical operational aspects. For each group of IEDs, the respective operational aspect is indicated or displayed, in the form of a label or tag, along with, or otherwise linked to, the group. As a consequence, a user may easily analyze the communication configuration of the system by looking at the generated graphical representation and determine, at a single glance, the consequences of IED failures or engineering errors on other IEDs and/or on the controlled and protected process.

WO 2009/135512 relates to a method for examining a communication connection between field devices of an automation system for electrical energy supply networks. A first field device is made to issue, by way of a testing device, a test data telegram to at least one other field device through a communication network belonging to the communication connection to be tested. At least one other field device sends a confirmation telegram to the testing device after receiving the test data telegram, and the testing device displays the receipt of all confirmation telegrams received as a reaction to the test data telegram.

The principles and methods of the following invention are by no means restricted to a use in substation automation, but likewise applicable to other process control systems with a formal system description. In particular, it has to be noted that IEC 61850 is also an accepted standard for Hydro power plants, Wind power systems, and Distributed Energy Resources (DER).

DESCRIPTION OF THE INVENTION

It is an objective of the invention to support and promote testing of Substation Automation (SA) functions involving intermediary Logical Nodes (LN) in SA systems of operating substations, specifically with minimized impact on the substation and/or the SA system and without having to completely deactivate or isolate entire parts of the substation. This objective is achieved by a method of testing a functionality according to the independent claim. Further preferred embodiments are evident from the dependent patent claims.

According to the invention, a test is set up by defining at least one input LN where the test scenario input signals will be applied, and by determining output LNs where expected output values shall be observed. Based on the data flow between LNs as defined in the System Configuration Description (SCD) file or some knowledge on functional architectures a test preparing tool or device automatically determines all intermediary, or intermediate, LNs logically arranged between these input and output LNs. Specifically, from the data objects available in the IED data model, from a Logical Device (LD) structure, and from the data flow between input LNs and output LNs the intermediary LNs and the IEDs that are affected by the function test are identified and subsequently marked for "test" or "simulation" mode. Hence, the test data flow will not be blocked between input and output LNs by an intermediary LN that is not in test mode and thus does not accept incoming data with test quality. The appropriate modes are set at all intermediate LNs at a suitable level of granularity, and automatically reset to normal operation at the end of the test.

Specifically, the invention relates to an operating SA system including a plurality of Intelligent Electronic Devices IEDs connected to a communication network, wherein the SA system is automating, i.e. protecting, controlling and monitoring, a substation in a power transmission or distribution network and wherein the SA system is described or represented by a SCD file according to IEC 61850 including LNs as independent data entities or functional data groupings assigned to, and implemented/instantiated on, individual IEDs. Testing a functionality then comprises the steps of indicating, by a testing person, an input Logical Node LN (PDIS) and an output LN (XCBR) of the SA function to be tested, identifying, in an automated manner, based on the SCD description, an intermediary LN (PTRC) receiving data from the input LN and providing data to the output LN, either directly or via other LNs and preferably by means of a shared process bus, setting, in an automated manner, an operating mode of the intermediate LNs to test mode, and setting an operating mode of the end LN to test blocked mode; and performing a test of the SA function.

Generic functional test scenarios define the input and output LNs together with input signal values to be set and output signal values to be observed in functional terms with functional names according to IEC 61850-6 (2009)/IEC 81346. Furthermore, simulated current/voltage values as the test data transmitted via GOOSE/SV messages to the input LNs may be part of a generic test scenario, which thus may include Input LNs: e.g. PDIS1, PDIS2, PDIS3
Input (simulated/test) signals (TVTR.SvVolt, TCTR.ScAmp)
Output LNs: XCBR
supervised output signals (XCBR.Pos.OpOk, XCBR.Pos, OpRcvd)

A specific test scenario additionally includes an indication of an unambiguous substation part such a substation bay involved in the function. The hierarchical structure of the functional terms (according to voltage level, bays, equipment) allows an easy and fast adaption of the generic test scenario to this and/or further switch yard architectures using the same functions. An SCD file describing a real SA system can be used to automatically translate the functional names to IED related names and thus identify the LN instances on the physical IEDs affected by the test. A same generic test scenario can be automatically adapted to systems with or without process bus.

The present invention enables testing of modified or added system functions, or system parts, in an operational Substation Automation system with minimum disturbance, e.g. during maintenance or retrofit tests. The invention supports the tester in setting up the test and simulation modes according to the IEC 61850 model for a specific function test in several steps, including identifying the totality of LNs for which said mode needs to be modified, and depicting or listing all further functions sharing an intermediate LN in order to verify that no unintended side effects occur. The approved test configuration is ultimately released to an automatic configuration process, which determines whether the test/test-blocked mode may be set individually per LN or just for an entire LD or even IED. After this configuration process the different test cases can be performed, and at the test end the whole test configuration settings inside the tested system part are returned to normal operation mode.

The present invention provides a dynamic setup for function testing inside a running system. A part of the function can also test the signal level connections between the LNs, based on working communication links or programmed signal connections inside an IED. The method according to the present invention can also be used for one IED only. In other words, the function part to be tested can be on one IED or distributed across several IEDs. With a tool this function part to be tested can be defined, including any intervening LNs that are possibly on intervening IEDs. The present invention also enables an easy way for defining the intervening LNs, based on the configured data flow at signal level. After function part is defined, the test can be automatically set up on the IED or IEDs, by setting all concerned LNs (not necessarily IEDs) into the test mode and switching the function's input signal to test input signals.

The method according to the present invention does not need any acknowledgement telegrams. For test monitoring, the testing device just subscribes to or explicitly reads the standard output signals from the function. Also the special test telegrams between the IEDs are not necessary. Instead of that, the "normal" telegrams can be used, in particular, only those signals valid for the test now marked with quality "test" according to IEC 61850.

BRIEF DESCRIPTION OF THE DRAWINGS

The subject matter of the invention will be explained in more detail in the following text with reference to preferred exemplary embodiments which are illustrated in the attached drawings, of which.

DETAILED DESCRIPTION OF PREFERRED EMBODIMENTS

Figure 1:
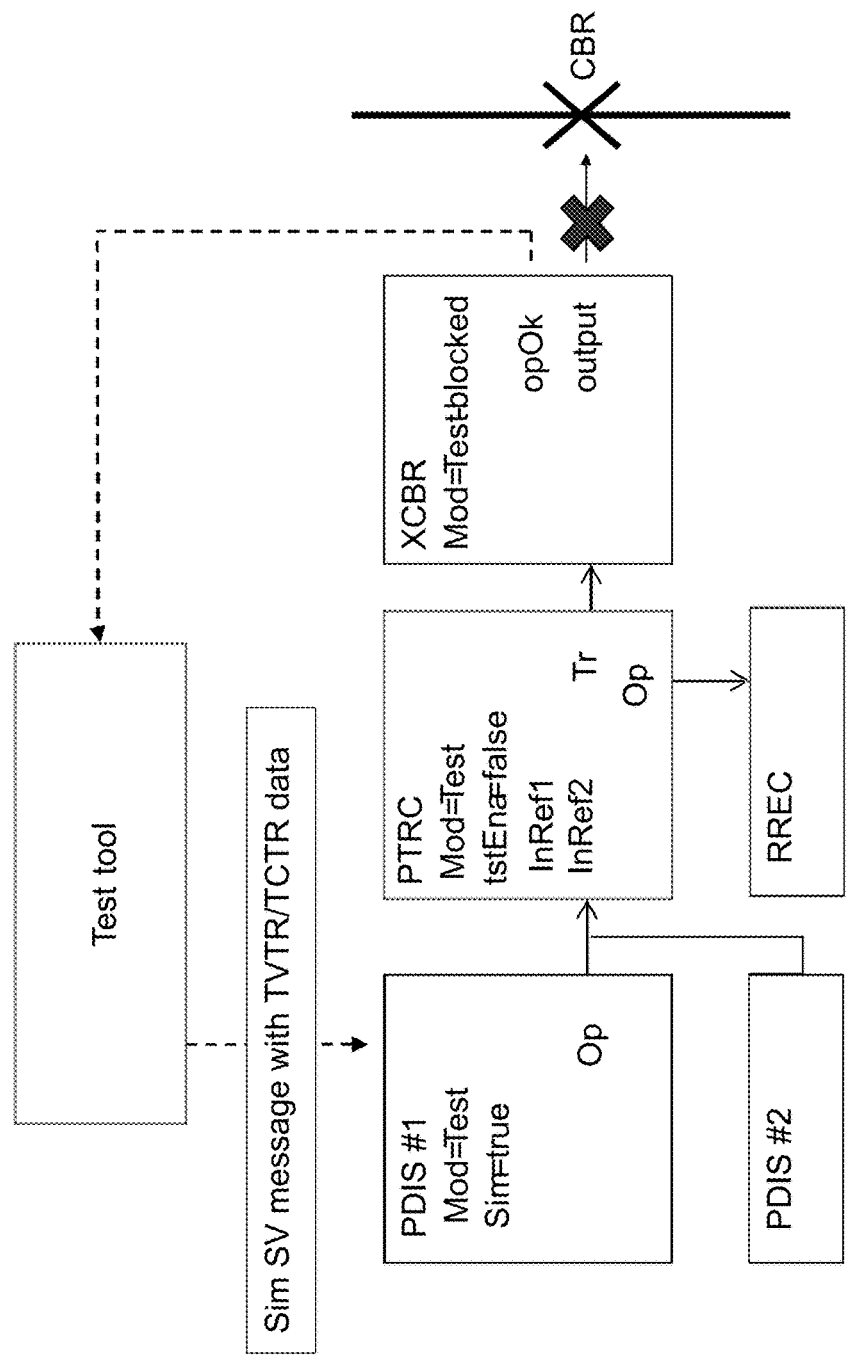
FIG. 1 depicts an exemplary test architecture, and
FIG. 2 lists excerpts of an IED section of a SCD according to IEC 61850.

FIG. 1 depicts an exemplary test architecture or set-up for testing of a distance protection function of a Substation Automation (SA) system without actually tripping a circuit breaker (CBR) of a real and operating substation. Messages including signals or commands are represented by arrows and transmitted over a process bus (not depicted). A test tool is part of the test environment and provides a simulated IEC 61850-9-2 LE data set comprising voltage and current values to an input Logical Node (LN) as described in EP 2203754. The input LN is a first instance of a Logical Node of class PDIS (Protection DIStance) which resides on and is executed by a first Logical Device (not depicted). The output LN is of the LN class XCBR (X Circuit BReaker), which in turn is implemented by a process-level device with hardware outputs for actuating or tripping the circuit breaker CBR. The LN PTRC (Protection TRip Conditioning) is an intermediary or intervening LN identified from the configured data flow of signals from PDIS to PTRC, and from PTRC to XCBR (e.g. by the data objects InRef1(PDIS.Op), InRef2 (PDIS.Str) in PTRC and Inref1(PTRC.Tr) in XCBR).

The output LN is expected to prove that it would correctly trip, but without actually having the circuit breaker CBR execute the command. Therefore the output LN is set to test-blocked mode, prohibiting hardware output activation. On the other hand, the "Pos" data object of the output LN XCBR is selected for evaluation by the test tool, providing the attributes Pos.opOk and Pos.opRcvd to judge if a trip would have been executed. The LN PTRC also needs to be set into test mode to pass any PDIS operation down to the XCBR.

The LN PTRC is a programmable combination of inputs that properly consolidates operating requests from several instances #1, #2, of PDIS as well as other types of LN. The logical node PTRC has a data object Tr representing the trip output which is used to operate the breaker. PTRC also has a data object Op representing the trip status and being sent to a RREC Recloser LN that in turn is responsible for coordinating reclosing actions. As is evident from FIG. 1, PDIS #2 and RREC are likewise influenced, with RREC not accepting the PTRC.Op input with test quality when performing the test rather than being set into test mode.

An exemplary test set up with a test preparation tool implementing features of the invention comprises the following aspects:

1. The tester selects the test input logical nodes (LN) respective logical devices (LD), i.e. those logical nodes/logical devices to which he wants to apply test inputs. The SCD file provides, in the substation section, a hierarchical functional view to the LNs, which may be filtered additionally by the LN class.
2. Based on the data flow defined in the SCD file the tool selects and offers the list of possible input signals to be simulated as test input signals on behalf of the input LN. Possible input signals include single-test input signals e.g. in case that an InRef data object with defined test signal source exists, a source input signal allowing a substituted value, or an incoming GOOSE/SV message with data set values that need to be simulated or provided by the testing tool.

3. The tester selects the signals or GOOSE/SV data sets where the tester wants to give simulated inputs for the test.
4. The tool investigates the LN mode management structure of the concerned LN/LD/IED to find out, where the test mode needs to be set, depending on the IEDs capabilities, and where simulation mode must be set to be able to receive simulated data sets as input. The result is shown to the tester inside an IED/LD/LN based data flow diagram of the system e.g. as described in EP 2362577, so that the tester can evaluate the influence on the still operating system during the test.
5. The tester selects the test output LNs, i.e. those LNs from which final signals shall be observed in order to judge the test results. Here the tester also decides if HW outputs need to be blocked or allowed by setting an LN to test-blocked mode or only test mode.
6. The tool suggests based on the selected output LNs a list of output signals to be observed or logged for the tester to choose from.
7. Based on this, the tool selects existing data communication definitions (data sets, control blocks) for the output signals and subscribes to them, defines them dynamically on the IEDs if needed and allowed by the concerned IED, or sets up read procedures at the right point in the test process.
8. Using the SCD data flow definition, the tool determines the paths from the input LNs to the output LNs and flags all intermediate LNs as test. This shall allow a complete set of LNs to be tested, without blocking the test data flow between inputs and outputs by a LN that is not in test mode and thus does not accept incoming data with test quality. The result is again presented to the tester as described in step 4.
9. The tester checks the set-up, might modify it as needed, and might identify additional signals from the found intermediate LNs for logging. Then the test definition is released to the system.
10. The tool sets all test/test-blocked modes as demanded, provides simulated input messages and substituted input signals as needed, using the actual process values as default values.
11. The tester selects the test input values, and by bringing these manually or from some script into the identified input signals, the test is actually performed and all selected output signals directly shown respectively any changes thereof are logged. The tool might compare the results against an already provided expected result, or leave it to the tester to judge the result.
12. When the tester finishes testing with different value sets, he ends the test. The tool automatically sets all LNs back to normal operating modes, starting with the output LNs and then going back against the data flow until it has reached the input LNs and finally any substituted input values.

A manual test execution might be recorded, thus defining a test description for later automatic test execution. This recording is done with function related signal identification, by again using an SCD file for translating IED related names to functional names. This allows to use the stored test scenario also for other substations/other bays in the same substation as well as other IED configurations (e.g. with/without process bus) for testing the same or similar function.

The data flow definition between the LNs can be provided inside InRef/BlkRef data objects, which for each LN contain the name of the incoming signal. Pure SCL options for data flow definition include 1. The destination list at each message control block (GOOSE/SV/Reports). This may define the destination IED or the destination LN. It is the first step to find 'raw' paths from the test input LNs towards further (intermediary or output) LNs, which however is often at IED level only.
2. The Input/ExtRef section inside SCL. This contains incoming signals per LD (valid for all LNs on this LD) or even per LN. This allows to set up the detailed paths at LN level, i.e. a fine grain definition based on the 'raw' definition of the first step. This is also used to define the detailed signal level data flow inside an IED.
3. The InRef/BlkRef and other data objects with CDC ORG are functionally similar to Input/ExtRef sections, however the reference value is also visible in the online IED and could be read from there.

FIG. 2 lists excerpts of an IED section of a Substation Configuration Description SCD according to IEC 61850. The SCD specifies in the IED section for each control block the receiver IEDs, i.e. the logical data flow is described at least at IED level, possibly down to Logical Node level. The first paragraph of FIG. 2 defines, for the exemplary IED "AA1C1Q01A1" and assigned to a Logical Device "LD0", the data set "InterlockingA" for distributed interlocking, and the data flow related to distributed interlocking, with IED "AA1C1Q01A1" as a source for respective GOOSE messages (e.g. "gcb_A" to IEDs "AA1C1Q07A1" and "AA1C1Q05A1"). This constitutes an example for data flow by destination IED (forward reference for path) according to option 1 above. A second Logical Device "SES_1" has an input section defining which signals from other IEDs (e.g. IED "AA1C1Q05A1") are determined for this IED "AA1C1Q01A1" as a sink. This constitutes an example for data flow definition by input section and incoming signals (backwards reference in path) according to option 2 above.

While the invention has been illustrated and described in detail in the drawings and the foregoing description, the invention is not limited to the disclosed embodiments. Other embodiments can be understood and effected by those skilled in the art and practising the claimed invention, from a study of the drawings, the description, and the appended claims. In the claims, the word "comprising" or "including" does not exclude other elements or steps, and the indefinite article "a" or "an" does not exclude a plurality. A single processor or controller or other unit may fulfil the functions of several items recited in the claims. The mere fact that certain features are recited in different dependent claims does not indicate that a combination of these features cannot be used to advantage, specifically, the claim dependency chosen does not exclude other meaningful claim combinations. The order of the method steps within individual claims is a preferred, but not necessarily the only order.

The invention claimed is:

1. A method of testing a functionality in an operating Substation Automation SA system including a plurality of Intelligent Electronic Devices IEDs connected to a communication network, wherein the SA system is automating a substation in a power network and wherein the SA system is described by a System Configuration Description SCD according to IEC 61850 and including Logical Nodes LNs as data entities assigned to individual IEDs, comprising
   indicating, by a testing person, an input Logical Node LN (PDIS) and an output LN (XCBR) of the functionality to be tested,
   identifying, based on data flow between the LNs defined in the SCD description, an intermediate LN (PTRC) receiving data from the input LN and providing data to the output LN, wherein the intermediate LN is logically arranged between the input LN and the output LN, setting an operation mode of the intermediate LNs to test mode; and performing the test.

2. The method of claim 1, wherein the step of indicating input LN and output LN comprises specifying an unambiguous substation part involved in the function to be tested.

3. The method of claim 2, comprising identifying IEDs hosting the intermediary LNs, and setting an operation mode of the identified IEDs to simulation mode.

4. The method of claim 2, comprising storing test scenarios as sets of input LNs and output LNs with appropriate input and output signals and functional names according to the SA functional structure, and adapting the test scenario by means of an SCD file to different physical system architectures or to other substation parts with similar structure.

5. The method of claim 1, comprising identifying IEDs hosting the intermediary LNs, and setting an operation mode of the identified IEDs to simulation mode.

* * * * *